PULSE DRIVER WITH LINEAR CURRENT RISE

Filed Dec. 27, 1965

INVENTOR
W. M. REGITZ
BY R. B. Anderson
ATTORNEY

United States Patent Office 3,436,563
Patented Apr. 1, 1969

3,436,563

PULSE DRIVER WITH LINEAR CURRENT RISE

William M. Regitz, Colonia, N.J., assignor to Bell Telephone Laboratories, Incorporated, New York, N.Y., a corporation of New York Filed Dec. 27, 1965, Ser. No. 516,312
Int. Cl. H03k 3/26, 5/08
U.S. Cl. 307—270 2 Claims

ABSTRACT OF THE DISCLOSURE

In a pulse driver the emitter circuit of the output transistor includes a resistor and inductor in series. Two feedback transistors provide variable shunts of the input drive pulses. One, driven by the voltage across the inductor, limits the rate of increase of output current to a constant value. The second, driven by the voltage across the inductor and resistor, limits the output pulse amplitude to a constant value.

This invention relates to current pulse drivers, and more specifically, to current pulse drivers having a linear current rise independent of supply voltage and load variations.

Current pulse drivers must be capable of delivering to their respective loads the necessary pulse energy within a prescribed load requirement. In certain applications, as for instance in magnetic memory systems which require a constantly accurate and noise-free operation, it is necessary that such current drive pulses have a predetermined rise time configuration that is constant from pulse to pulse and is, in addition, independent of supply voltage as well as load variations.

Although current pulse drivers having substantially constant rise time characteristics have been devised before, they employ relatively complex circuitry or exhibit other limiting characteristics, such as high power consumption, severe component specifications, and excessive voltage requirements.

The primary object of the invention is to increase the operating efficiency of current pulse rivers.

Another object of the invention is to decrease the power supply voltage requirement for current pulse drivers.

A further object of the invention is to decrease the breakdown voltage requirement of the output transistors of current pulse drivers.

To fulfill these objects, the invention provides for a current pulse driver that features a linear current rise. More specifically, one embodiment of the invention comprises a current pulse driver having a common emitter output stage driven by a pulse source and supplying pulse energy to a load that may have a power factor other than unity. The output stage has the series combination of a resistor and inductor connected between the emitter electrode of the output transistor and circuit common, respectively. Two feedback stages effectively bypass the base-emitter circuit of the output stage to control its drive input. The first feedback stage is responsive to the emitter voltage of the output stage to control pulse current during the flat-top portion of the output pulse. The second stage, on the other hand, while being responsive to the current through the inductor also fixes and limits the voltage across the inductor to a constant value during the current rise period, thereby forcing the inductor current, and consequently the emitter as well as the load current, to increase linearly.

The current rise of successive output pulses of the current driver is, therefore, controlled by the current rise through the inductor, where such rise is a function of the inductance of the particular inductor together with the fixed voltage maintained across it during the actual current rise period. As a result of this linear current rise characteristic the current pulse driver power consumption is decreased considerably, the voltage requirement for the power supply is lowered, and the breakdown voltage requirement of the output transistor is less stringent. Another feature of the invention is its capability to produce linear rise output pulses independent of load power factor and load variation.

The above and other features of the invention will be more fully understood from the following detailed description considered in conjunction with the drawings in which.

Figure 1:
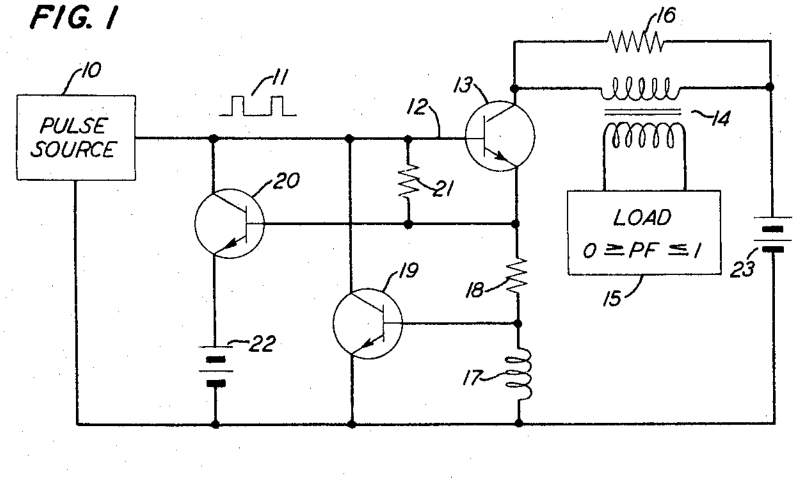
FIG. 1 is a schematic diagram of one specific embodiment of the invention.

In FIG. 1 a current pulse driver is shown comprising a pulse source 10 supplying positive pulses 11 to base electrode 12 of output transistor 13. Output transformer 14, in turn, couples the output from the collector of transistor 13 to load 15. Resistor 16, connected in parallel with the primary winding of output transformer 14, functions as output transformer damping resistor. Inductor 17 and resistor 18 are connected in series in the emitter circuit of output transistor 13 and function together with transistors 19 and 20 to provide for the desired pulse current control. Resistor 21 presents a low impedance path across the base-emitter junction of output transistor 13 during normal transistor off-time to prevent spurious input signals from randomly triggering the pulse circuit. Voltage source 22, a regulated reference voltage, is connected through the base-emitter junction of transistor 20 to the emitter electrode of output transistor 13, to determine the maximum pulse output current. Voltage source 23, on the other hand, supplies the required operating voltage for the entire current pulse driver.

Figures 3A, 3B, 3C, 3D:
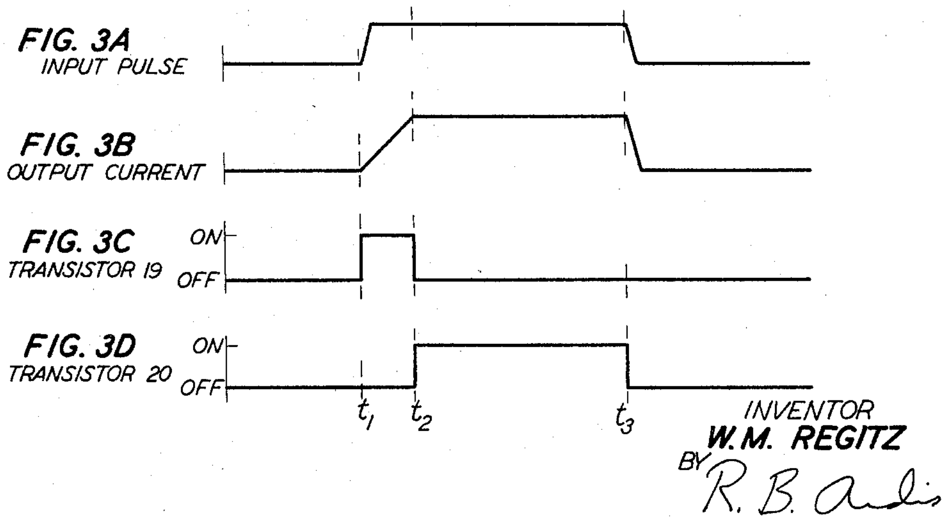
FIGS. 3A to 3D show waveforms illustrating the operation of the embodiments of FIG. 1 and FIG. 2.

When the output of pulse source 10 is zero, transistors 13, 19, and 20 are not conducting and the pulse input to load 15 is consequently also zero. A positive pulse applied from the pulse source 10 to the base-emitter circuit of output transistor 13, on the other hand, drives that transistor into conduction, thereby supplying a corresponding output pulse to load 15. However, as a result of the linear current rise feature of the instant invention, together with its inherent current regulation, a current output pulse as shown in FIG. 3B is coupled to the load in response to an input pulse as shown in FIG. 3A. The slope of the leading edge of the current output pulse between times $t_1$ and $t_2$ is substantially linear, the pulse is devoid of any ringing, and the pulse top is essentially flat during its conduction period, in contrast to other current drivers which generally produce output pulses that have exponential rise time characteristics together with pulse ringing and nonregulated pulse current.

The linear current rise feature of the instant invention is produced as a result of the action of inductor 17 in conjunction with transistor 19, the base-emitter junction of which is connected in parallel with inductor 17. When a positive pulse as shown in FIG. 3A is applied to the current pulse driver, the input pulse tends to immediately turn on transistors 13 and 19, whereas transistor 20 remains initially back biased by reference voltage 22. Current, therefore, starts to flow in the emitter circuit of transistor 13 and a voltage is induced in inductor 17 because of the change in current through it. This change in current induces substantially simultaneously with the application of the input pulse at time $t_1$ a sufficient voltage across inductor 17 to turn on transistor 19 at time $t_1$ as shown in FIG. 3C. That is, transistor 19 is at that instant forced to conduct and thereby bypasses through its emitter-collector path excess drive applied to base 12 of output transistor 13.

The intial change in current through inductor 17 which caused transistor 19 to conduct, establishes across inductor 17 a voltage equal to the base-emitter junction voltage of transistor 19. The base-emitter junction voltage of a transistor, however, is substantially independent of junction current because of the inherent base-emitter junction characteristics of such transistor. Consequently, the voltage across inductor 17 is limited to and fixed by the base-emitter voltage of transistor 19 to that base-emitter junction voltage as long as a changing current through the inductor induces a voltage in the inductor.

When, therefore, at time $t_1$ an input pulse is applied to the current pulse driver, pulse current starts to flow in the emitter circuit of transistor 13. The voltage across inductor 17, induced by the increasing emitter current, reaches substantially instantaneously a voltage sufficient to forward bias transistor 19. At that instant, that is, when transistor 19 is forward biased, a comparatively small part of the emitter current is channeled to the base of transistor 19 to enable that transistor's feedback function. At the same time, however, the emitter current tends to keep on increasing in response to the input pulse. But because of the constant voltage across inductor 17 the general current-voltage relationship $$L\frac{di}{dt}=e$$

for an inductor reduces for inductor 17 to a linear relationship $$E=V_{be}=L\frac{\Delta i}{\Delta t}=\text{constant}$$

As a result, the current through inductor 17 is directly proportional to time and consequently must increase in a linear fashion. Since, however, the current through inductor 17 is substantially equal to the collector current of transistor 13, it follows that the output pulse current also rises linearly.

At the inductor current increases linearly, the emitter voltage of transistor 13 increases correspondingly because of the voltage developed across resistor 18. That is, at any particular instant the emitter voltage of transistor 13, $V_{e(13)}$, is equal to $V_L+R_{18}i(t)$, which is equal to $V_{be(19)}+R_{18}i(t)$, where $i(t)$ is the instantaneous emitter current, $V_L$ is the voltage across the inductor, $R_{18}i(t)$ is the voltage developed across resistor 18, and $V_{be(19)}$ is the base-emitter voltage of transistor 19. At time $t_2$ of FIG. 3 the emitter current has risen to such a value that the emitter voltage $V_{e(13)}$ of transistor 13 is equal to the sum or reference voltage 22, $V_{Ref}$, and the base-emitter voltage of transistor 20, $V_{be(20)}$; that is, $V_{e(13)}=V_{Ref}+V_{be(20)}$. Transistor 20 therefore becomes forward biased by the emitter voltage $V_{e(13)}$, thereby fixing that emitter voltage to a constant voltage equal to the sum of the reference voltage and the base-emitter voltage of transistor 20. As a result of the fixed emitter voltage, $V_{e(13)}$, together with the current regulation effect of transistor 20, emitter current of transistor 13 can no longer increase and therefore levels off to a constant value for the remainder of the pulse period $t_2$ to $t_3$ as shown in FIG. 3B. It is to be understood that transistor 13 must be held within its linear operating region to obtain the desired current control. Since the current through the inductor is identical to the emitter current of transistor 13, the inductor current also levels off to the same constant current and, consequently, because of its steady state value, it ceases to induce a voltage in inductor 17. As a result, the voltage across inductor 17 is reduced to zero, thereby removing the forward bias from transistor 19 and turning it off. FIGS. 3C and 3D illustrate the respective on and off conditions of transistors 19 and 20 during a particular pulse cycle. Transistor 19 is shown to conduct and control the output drive during the rise time from $t_1$ to $t_2$, whereas transistor 20 performs the current control function during the remaining pulse period from time $t_2$ to time $t_3$.

Since the current rise characteristic of the current pulse driver is a function only of the inductance characteristic of the inductor in combination with the fixed voltage across the inductor, it is evident that the current rise is independent of load variations as well as supply voltage variations. This feature of the present invention is particularly important where the driven circuitry requires accurate, fixed current rise pulses even though the load impedance or supply voltage varies.

The significance of the linear current rise feature of the present invention becomes particularly apparent when examining the required circuit parameters of a current pulse driver for a given load condition during the rise time of the pulse. For example, where a current pulse driver having an exponential rise pulse is used to drive, for instance, a specific inductive load L with a resistive component R, a current requirement I, and a time constant $\tau$, the voltage requirement during the rise time for such current pulse driver may be approximated by the equation $$e_1=\frac{LI}{\tau}+IR$$

resulting in a voltage requirement of approximately 100 volts. This high voltage requirement necessarily imposes extremely high voltage breakdown characteristic requirements on associated transistors. Another direct consequence of the high voltage requirement is high power consumption for the drive transistor. These three limitations namely, the high voltage requirement, the high transistor breakdown characteristic, and the high power consumption, severely limit the application and usefulness of such current pulse driver.

When, on the other hand, an embodiment of the present invention having a linear current rise is utilized as current pulse driver for an identical load, the circuit requirements are considerably less stringent. The voltage requirement during the linear rise time may be expressed as $$e_2=\frac{LI}{T}+IR$$

where T is the linear rise time which is related to the exponential rise time of the preceding example by a factor of approximately 2.2, that is, $T\approx2.2\tau$. The above equation reduces therefore to $$e_2=\frac{LI}{2.2\tau}+IR$$

Since the term IR may be substantially disregarded in both equations, the equation for $e_1$ reduces to $$e_1\approx\frac{LI}{\tau}$$

whereas the equation for $e_2$ reduces to $$e_2\approx\frac{LI}{2.2\tau}$$

It is therefore evident that the resultant voltage requirement for the linear rise current pulse driver is more than halved from that of the current pulse driver having an exponential current rise. This voltage reduction automatically reduces by a proportional amount the transistor voltage breakdown requirement as well as the over-all and, particularly, the output transistor power consumption.

It is, therefore, evident that the present invention, featuring current pulses having a linear current rise independent of supply voltage or load variations, provides for highly efficient current pulse drivers.

Figure 2:
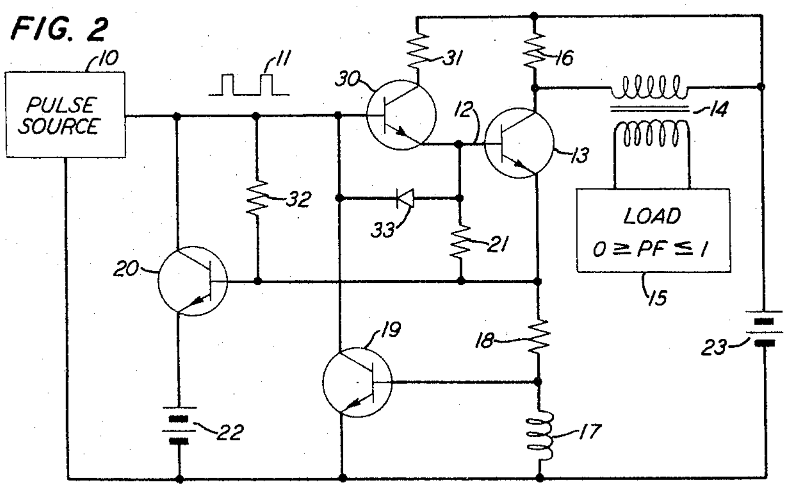
FIG. 2 is a schematic diagram of another embodiment of the invention having an increased pulse current capacity.

FIG. 2 depicts another embodiment of the invention having increased drive current capacity. The circuit is identical to the embodiment of FIG. 1 except for the addition of transistor 30, resistors 31 and 32, and diode 33.

Transistor 30 has its base-emitter junction connected between pulse source 10 and base electrode 12 of transistor 13, and has its collector electrode connected through current limiting resistor 31 to the positive terminal of voltage source 23. Diode 33 provides for a reverse current path to aid in the turn-off of transistor 13 at the termination of respective input pulses. Resistor 32 offers during normal transistor off-time a low impedance path across the base-emitter junction of transistors 13 and 30 to undesired input signals, thereby preventing random triggering due to these spurious input signals. The circuit of FIG. 2 functions in the same manner as the circuit of FIG. 1, except that transistors 13 and 30 are connected in a Darlington type circuit to provide for additional current drive capabilities. The advantages of the linear current rise pulse driver are therefore further enhanced by an additional drive current capability. The waveforms of FIGS. 3A through 3D as described in conjunction with the operation of the embodiment of FIG. 1 illustrate the operation of the embodiment of FIG. 2 as well.

It is to be understood that the above-described arrangements are illustrative of the application of the principles of the invention. Numerous other arrangements may be devised by those skilled in the art without departing from the spirit and scope of the invention.

What is claimed is:

1. A current pulse driver for supplying output pulses with a leading edge of constant slope comprising a first transistor having collector, emitter and base electrodes; a power source having first and second terminals; a load which may have a power factor other than unity; output coupling means connected between said first transistor collector electrode and said power source first terminal for coupling said output pulses to said load; a resistor connected to said first transistor emitter electrode; an inductor connected between said resistor and said power source second terminal; an input pulse source connected to said power source second terminal; a second transistor having a base electrode connected to said input pulse source, an emitter electrode connected to said first transistor base, and a collector electrode connected to said power source first terminal; a third transistor having a collector electrode connected to said input pulse source, an emitter electrode connected to said power source second terminal, and a base electrode connected to the junction between said resistor and said inductor; a reference voltage source connected to said power source second terminal; and a fourth transistor having a collector electrode connected to said input pulse source, an emitter electrode connected to said reference voltage source, and a base electrode connected to said first transistor emitter electrode.

2. A current pulse driver for supplying output pulses with a leading edge of constant slope to a load comprising an output transistor having base emitter and collector electrodes, the series combination of a resistor and inductor connected to said emitter electrode, a source of operating potential, output coupling means for coupling said output pulses to said load connected in a series circuit including said source of operating potential, said collector and emitter electrodes, said resistor and said inductor, a source of input pulses, means connecting said source of input pulses in a series circuit including said base and emitter electrodes, said resistor and said inductor to bias intermittently said transistor into conduction, feedback means connected across said input pulse source and across said inductor to vary the portion of the input pulses applied to the base electrode of said output transistor in response to the voltage across said inductor, the voltage across said inductor being thereby limited to a constant value, a source of reference potential, and a pulse amplitude limiting transistor having a collector electrode connected to said input pulse source, an emitter electrode connected to said reference potential source and a base electrode connected to the junction of said output transistor emitter and said resistor, whereby the current through said inductor and said load increases at a linear rate in response to an input pulse and the output transistor emitter current is limited to a predetermined value.

References Cited

UNITED STATES PATENTS 3,126,490 3/1964 Stern ______________ 307—88.5
3,311,900 3/1967 Gaunt __________ 307—88.5 XR ARTHUR GAUSS, *Primary Examiner.*

J. ZAZWORSKY, *Assistant Examiner.*

U.S. Cl. X.R.

307—228, 237, 263, 315